US011789650B2

(12) United States Patent
Na

(10) Patent No.: US 11,789,650 B2
(45) Date of Patent: Oct. 17, 2023

(54) STORAGE DEVICE AND METHOD OF OPERATING THE SAME

(71) Applicant: SK hynix Inc., Icheon-si (KR)

(72) Inventor: Chung Un Na, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 42 days.

(21) Appl. No.: 17/327,310

(22) Filed: May 21, 2021

(65) Prior Publication Data

US 2022/0156004 A1  May 19, 2022

(30) Foreign Application Priority Data

Nov. 17, 2020  (KR) .................. 10-2020-0154017

(51) Int. Cl.
*G06F 12/00* (2006.01)
*G06F 3/06* (2006.01)

(52) U.S. Cl.
CPC .......... *G06F 3/0659* (2013.01); *G06F 3/0604* (2013.01); *G06F 3/0679* (2013.01)

(58) Field of Classification Search
CPC ............. G06F 12/0875; G06F 12/0269; G06F 2212/604; G06T 1/20; G06T 1/60
See application file for complete search history.

(56) References Cited

U.S. PATENT DOCUMENTS

| | | | | |
|---|---|---|---|---|
| 2002/0144053 A1* | 10/2002 | Yada | ...................... | G06F 3/0605 |
| | | | | 712/E9.083 |
| 2012/0163081 A1* | 6/2012 | Park | ...................... | G11C 16/26 |
| | | | | 365/185.11 |
| 2013/0124888 A1* | 5/2013 | Tanaka | ................... | G11C 16/34 |
| | | | | 713/320 |
| 2013/0198589 A1* | 8/2013 | Choi | .................... | G06F 11/1072 |
| | | | | 714/763 |
| 2014/0059656 A1* | 2/2014 | Maeda | .................. | G06F 3/0679 |
| | | | | 726/4 |
| 2014/0223246 A1* | 8/2014 | Kim | .................... | G11C 16/0483 |
| | | | | 714/718 |
| 2018/0129601 A1* | 5/2018 | Tanaka | ................... | G06F 3/0659 |
| 2019/0205244 A1* | 7/2019 | Smith | ..................... | G06F 3/065 |
| 2019/0243734 A1* | 8/2019 | Kim | ....................... | G06F 3/0647 |
| 2019/0259428 A1* | 8/2019 | Choi | ...................... | G11C 16/30 |
| 2019/0265908 A1* | 8/2019 | Kim | ....................... | G06F 3/0659 |

(Continued)

FOREIGN PATENT DOCUMENTS

| | | |
|---|---|---|
| KR | 20190100780 A | 8/2019 |
| KR | 10-2085096 | 3/2020 |

*Primary Examiner* — Shawn X Gu
*Assistant Examiner* — Mohammad S Hasan
(74) *Attorney, Agent, or Firm* — Perkins Coie LLP

(57) ABSTRACT

The present technology relates to an electronic device. According to the present technology, a storage device includes a memory device configured to include memory cells for storing data and circuitry structured to generate voltage information indicating whether a voltage used for performing an operation on the memory cells is included in a preset voltage range; and a memory controller in communication with the memory device and configured to transmit, to the memory device, a status command requesting for a status response indicating a status of the operation, and control the memory device to change a voltage used for performing the operation based on the status response provided from the memory device and including the voltage information.

17 Claims, 13 Drawing Sheets

(56) References Cited

U.S. PATENT DOCUMENTS

| | | | |
|---|---|---|---|
| 2020/0133510 A1* | 4/2020 | Koudele | G06F 3/0614 |
| 2020/0133806 A1* | 4/2020 | Her | G11C 16/0483 |
| 2021/0096773 A1* | 4/2021 | Seong | G11C 16/30 |
| 2022/0246224 A1* | 8/2022 | Wan | G11C 16/0483 |

* cited by examiner

STORAGE DEVICE AND METHOD OF OPERATING THE SAME

CROSS-REFERENCE TO RELATED APPLICATION

This patent document claims priority to and benefits of the Korean patent application number 10-2020-0154017, filed on Nov. 17, 2020, which is incorporated herein by reference in its entirety.

TECHNICAL FIELD

The technology and implementations disclosed in this patent document relate to an electronic device, and more particularly, to a storage device and a method of operating the same.

BACKGROUND

Storage devices refer to electronic components that are configured to store data on a permanent or temporary basis. Each storage device may include one or more storage medium to store data and operate based on a request from control of a host device such as a computer or a smartphone. A storage device may include a memory device for storing data and may further include a memory controller controlling the memory device to store or retrieve data. The memory device can be classified based on the type of storage medium. For example, the memory device may be classified into a volatile memory device and a nonvolatile memory device.

A volatile memory device may store data only when power is supplied. Thus, such a volatile memory device loses its data in the absence of power. Examples of the volatile memory device may include a static random access memory (SRAM) or a dynamic random access memory (DRAM).

A nonvolatile memory device can retain its data in the absence of power. The nonvolatile memory device includes a read only memory (ROM), a programmable ROM (PROM), an electrically programmable ROM (EPROM), an electrically erasable and programmable ROM (EEPROM), or a flash memory.

SUMMARY

An embodiment of the disclosed technology provides a storage device including a memory device that provides information indicating whether an operation is at a valid operation voltage to a memory controller, and a memory controller that controls the memory device, and a method of operating the storage device.

According to an embodiment of the disclosed technology, a memory device may comprise a memory cell array including a plurality of memory cells, a peripheral circuit coupled to the memory cell array and configured to perform an operation on a memory cell selected among the plurality of memory cells; a register including information on a voltage to be used for the operation; an operation processor in communication with the register to receive the information on the voltage for the operation and in communication with a memory controller outside the memory device to receive a command to perform the operation from the memory controller and configured to control the peripheral circuit to perform the operation on a selected memory cell using the voltage and generate status information related to a status of the operation; a voltage information generator in communication with the register and configured to generate, in response to the command, voltage information indicating whether the voltage is within a preset voltage range; and a status register in communication with the voltage information generator and configured to store the status information and the voltage information.

According to an embodiment of the disclosed technology, a memory device may include a memory cell array including a plurality of memory cells, each memory cell structured to store data; a peripheral circuit coupled to the memory cell array and configured to perform a read operation to read data stored in a memory cell selected among the plurality of memory cells; a read level register including information on a level of a read voltage used for the read operation; a voltage information generator configured to generate voltage information indicating whether the read voltage is in a preset voltage range; a read operation processor configured to control the peripheral circuit whether to read the data from the selected memory cell using the read voltage and generate status information related to a completion of the read operation; and a status register configured to store the status information and the voltage information.

According to an embodiment of the disclosed technology, a storage device may include a memory device configured to include memory cells for storing data and circuitry structured to generate voltage information indicating whether a voltage used for performing an operation on the memory cells is included in a preset voltage range; and a memory controller in communication with the memory device and configured to 1) transmit, to the memory device, a status command requesting for a status response indicating a status of the operation, and 2) control the memory device to change a voltage used for performing the operation based on the status response provided from the memory device and including the voltage information.

According to the present technology, a storage device including a memory device that provides information indicating whether an operation is at a valid operation voltage to a memory controller, and a memory controller that controls the memory device, and a method of operating the storage device are provided.

DETAILED DESCRIPTION

Various embodiments of the disclosed technology can be carried out in various forms. In the below, some example implementations of the disclosed technology will be explained with reference to the figures.

Figure 1:
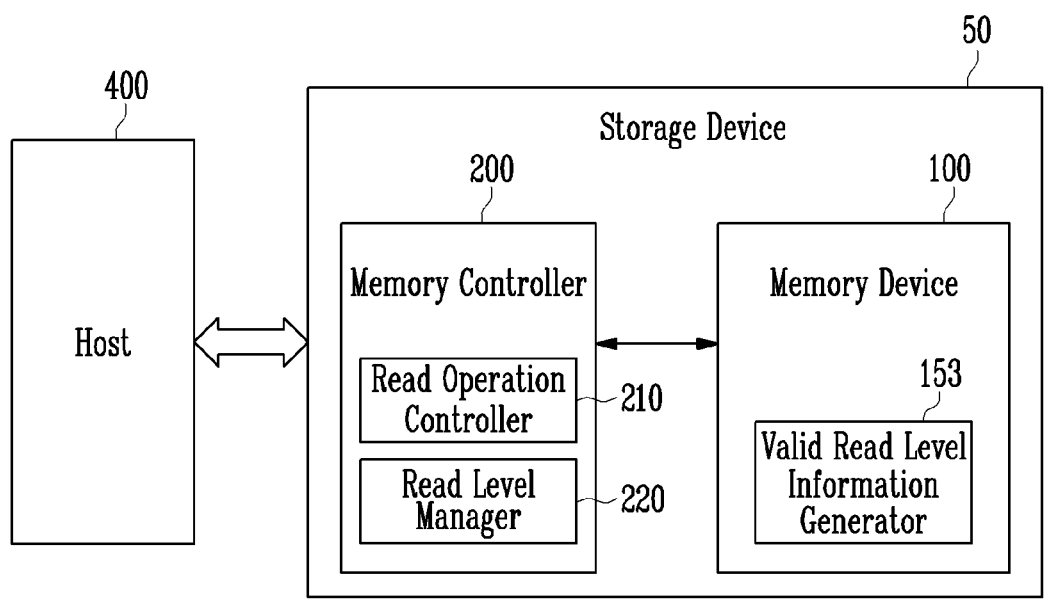
FIG. 1 is a diagram illustrating an example of a storage device based on an embodiment of the disclosed technology.

FIG. 1 is a diagram illustrating a storage device according to an embodiment of the disclosed technology.

Referring to FIG. 1, the storage device 50 may include a memory device 100 and a memory controller 200. The storage device 50 may be a device that stores data under control of a host 400 such as a cellular phone, a smartphone, an MP3 player, a laptop computer, a desktop computer, a game player, a TV, a tablet PC, or an in-vehicle infotainment system. Alternatively, the storage device 50 may be a device that stores data under the control of the host 400 that stores high-capacity data in one place, such as a server or a data center.

The storage device 50 may be manufactured as one of various types of storage devices according to a host interface that is a communication interface between the host 400 and the storage device 50. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, or a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), or a wafer-level stack package (WSP).

The memory device 100 may provide a storage space where data to be processed and/or instructions to be executed is stored. The memory device 100 may include the logic needed to read from and write to the memory device 100 and be operated in response to requests from the memory controller 200. The memory device 100 may include a memory cell array (not shown) including a plurality of memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits The memory cell array (not shown) may include a plurality of memory blocks. Each memory block may include a plurality of pages, and each page corresponds to a plurality of memory cells. Each memory block may include a plurality of pages. In an embodiment of the disclosed technology, read and program (write) operations are performed on a page basis, and erase operations are performed on a block basis.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In this patent document, some implementations may be explained for the memory device 100 which is implemented as a NAND flash memory but other implementations are also possible.

The memory controller 200 can access the memory device 100 based on requests from the user/host by providing command/address signals to the memory controller 200. In some implementations, the memory device 100 may receive, from the memory controller 200, a command and an address in which the command is performed or executed. The memory device 100 may perform an operation instructed by the command on the area selected by the address. For example, the memory device 100 may perform a write operation (program operation), a read operation, and/or an erase operation. During the program operation, the memory device 100 may program data in the area selected by the address. During the read operation, the memory device 100 may read data from the area selected by the address. During the erase operation, the memory device 100 may erase data stored in the area selected by the address.

The memory device 100 may include a valid read level information generator 153.

The valid read level information generator 153 may generate valid read level information indicating whether a read voltage used during the read operation is in a valid read voltage range. In some implementations, the valid read level information may be information indicating whether the read operation has been performed with a read voltage in the valid read voltage range. In some other implementations, the valid read level information generator 153 may determine, before performing the read operation, whether the read voltage set for the read operation is in the valid read voltage range. In this case, the read operation may be performed or not depending on the determination. The valid read voltage range may be between a minimum read voltage and a maximum read voltage and be determined during a test process of the memory device 100.

When the read operation is performed with the read voltage that is not included in the valid read voltage range, the read operation may obtain inaccurate read data and the read operation fails.

The valid read level information generator 153 may store the generated valid read level information in a status register included in the memory device 100. The status register may be a register that stores status information indicating an operation status of the memory device 100. The memory controller 200 may provide a command instructing to perform an operation to the memory device 100, and after a predetermined time, the memory controller 200 may provide a command for requesting the status information stored in the status register to the memory device 100.

The status information provided by the memory device 100 indicates the status of the read command, e.g., whether the read command previously provided to the memory device 100 has been completed or not. In an embodiment of the disclosed technology, the memory device 100 configures the status information by including the valid read level information indicating whether the read voltage used for performing the read operation is set in the valid read voltage range. Thus, the memory controller 200 can be informed based on the status information as to whether the operation has been successfully completed and whether the read operation has been performed with the voltage in the valid read voltage range.

In some implementations, when the operation is performed with an invalid read voltage, the memory controller 200 may provide a command instructing to change the read voltage to the memory device 100.

In another embodiment, the memory device 100 may determine whether a voltage set to be used to perform the read operation has a voltage level in the valid read voltage range before performing the read operation, and provide the result as valid read level information. In some implementations, when the voltage set for the read operation has the voltage level that is not within the valid read voltage range, the memory controller 200 may control the memory device 100 not to perform the read operation. Through this, it is possible to prevent from performing the read operation with the invalid read voltage.

In this patent document, the memory device 100 is described as generating the valid read level information for the read operation, but the above method may be applied to the program operation and/or the erase operation without being limited to the read operation.

Thus, the memory device 100 may include valid level information indicating, in the status information, whether operation voltages used for performing operations including the program operation, the read operation, and the erase operation are set in the valid voltage range, and may provide the valid level information to the memory controller 200. Therefore, the memory controller 200 can obtain, from the status information, information as to whether a corresponding operation has been completed or failed and additional information as to whether the corresponding operation has been performed with the voltage in the valid operation voltage range.

In various embodiments, the memory device 100 may determine, before performing the corresponding operation, whether the voltage set to be used for performing the corresponding operation has the voltage level in the valid voltage range, and provide the result as the valid level information. Through this, it is possible to prevent from performing the corresponding operation with the invalid voltage.

The memory controller 200 may control an overall operation of the storage device 50.

When power is applied to the storage device 50, the memory controller 200 may execute firmware (FW). When the memory device 100 is a flash memory device, the memory controller 200 may execute firmware such as a flash translation layer (FTL) for controlling communication between the host 400 and the memory device 100.

In an embodiment, the memory controller 200 may receive data and a logical address (LA) from the host 400 and may convert the LA into a physical address (PA) indicating an address of memory cells to or from which data is to be written or read.

The memory controller 200 may control the memory device 100 to perform the program operation, the read operation, and/or the erase operation based on a request of the host 400. During the program operation, the memory controller 200 may provide a program command, the PA, and data to the memory device 100. During the read operation, the memory controller 200 may provide a read command and the PA to the memory device 100. During the erase operation, the memory controller 200 may provide an erase command and the PA to the memory device 100.

In an embodiment, the memory controller 200 may generate a command, an address, and data on independently regardless of the request from the host 400 and transmit the command, the address, and the data to the memory device 100. For example, the memory controller 200 may provide, to the memory device 100, the command, the address, and the data for performing a program operation, a read operation, and an erase operation. The memory controller 200 may provide, to the memory device 100, the command, the address, and the data to perform wear leveling, read reclaim, garbage collection, or others.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other.

The memory controller 200 may include a read operation controller 210 and a read level manager 220.

The read operation controller 210 may control an overall operation related to the read operation performed on the memory device 100. Specifically, the read operation controller 210 may provide a read command instructing to read stored data to the memory device 100.

When a predetermined time elapses after the read command is provided to the memory device 100, the read operation controller 210 may provide, to the memory device, a status read command requesting the status information stored in the status register included in the memory device 100.

The read operation controller 210 may receive a status read response provided in response to the status read command by the memory device 100. The read operation controller 210 may obtain the valid read level information included in the read status response and provide the obtained valid read level information to the read level manager 220.

The read level manager 220 may provide a read voltage change command instructing to change a level of the read voltage to the memory device 100. In some implementations, the read level manager 220 may provide the read voltage change command to the memory device 100 by using a parameter setting command (set parameter) or a feature setting command (set feature). For example, the read level manager 220 may provide an address of a read level register included in the memory device 100 and data corresponding to a read level to be changed to the memory device, by using the parameter setting command (set parameter) or the feature setting command (set feature).

In an embodiment, the read level manager 220 may provide the memory device 100 with the read voltage change command instructing to change the level of the read voltage according to the valid read level information. When the level of the read voltage used for the performed read operation does not belong to the valid read voltage range, the read voltage change command may be provided to the memory device 100.

The host 400 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), or a load reduced DIMM (LRDIMM).

Figure 2:
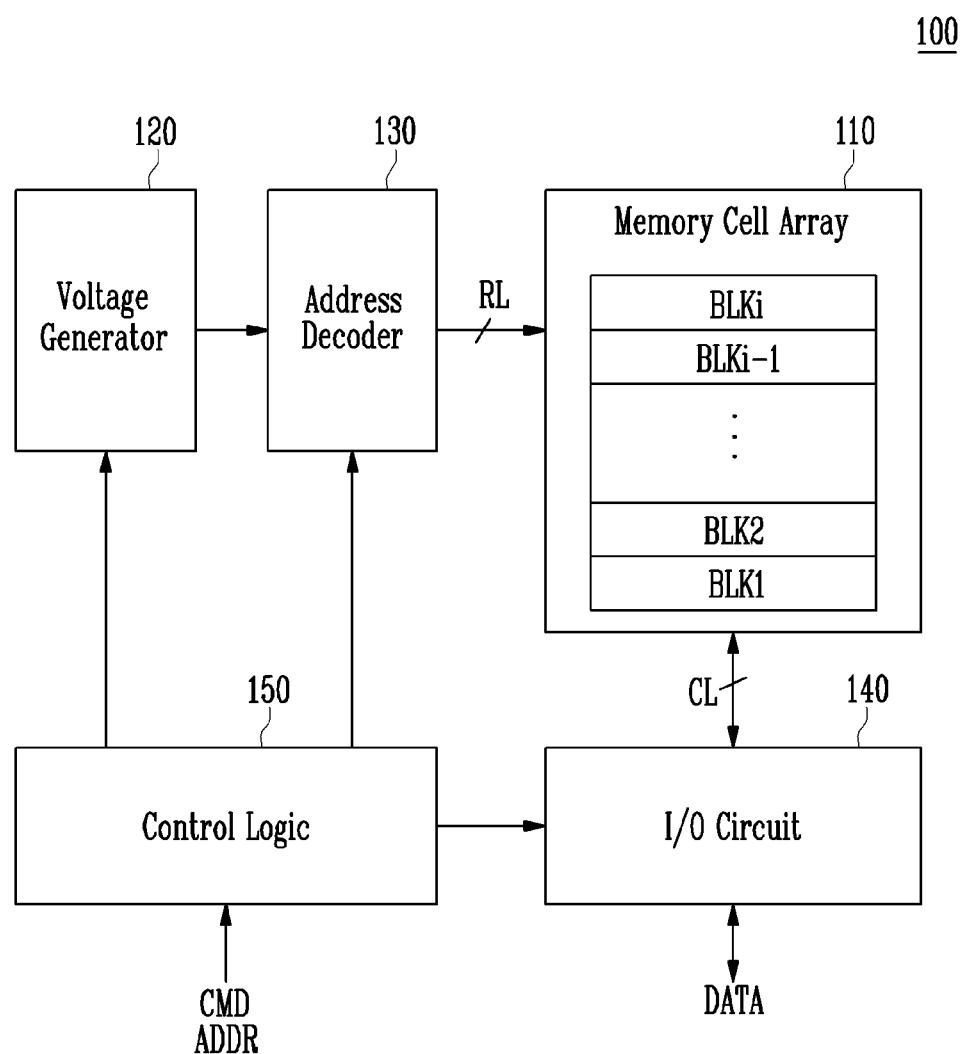
FIG. 2 is a diagram illustrating an example of a memory device of FIG. 1.

FIG. 2 is a diagram illustrating the memory device of FIG. 1.

Referring to FIG. 2, the memory device 100 may include a memory cell array 110, a voltage generator 120, an address decoder 130, an input/output circuit 140, and a control logic 150.

The memory cell array 110 includes a plurality of memory blocks BLK1 to BLKi. The plurality of memory blocks BLK1 to BLKi are connected to the address decoder 130 through row lines RL. The plurality of memory blocks BLK1 to BLKi may be connected to the input/output circuit 140 through column lines CL. In an embodiment, the row lines RL may include word lines, source select lines, and drain select lines. In an embodiment, the column lines CL may include bit lines.

Each of the plurality of memory blocks BLK1 to BLKi includes a plurality of memory cells. In an embodiment, the plurality of memory cells may be nonvolatile memory cells. Memory cells connected to the same word line among the plurality of memory cells may be defined as one physical page. That is, the memory cell array 110 may include a plurality of physical pages. Each of the memory cells of the memory device 100 may be configured as an SLC that stores one data bit, an MLC that stores two data bits, a TLC that stores three data bits, or a QLC capable of storing four data bits.

In an embodiment, the voltage generator 120, the address decoder 130, and the input/output circuit 140 may be collectively referred to as a peripheral circuit. The peripheral circuit may drive the memory cell array 110 based on the control of the control logic 150. The peripheral circuit may drive the memory cell array 110 to perform the program operation, the read operation, and the erase operation.

The voltage generator 120 is configured to generate a plurality of operation voltages using an external power voltage supplied to the memory device 100. The voltage generator 120 operates in response to the control of the control logic 150.

In an embodiment, the voltage generator 120 may generate an internal power voltage by regulating the external power voltage. The internal power voltage generated by the voltage generator 120 is used as an operation voltage of the memory device 100.

In an embodiment, the voltage generator 120 may generate the plurality of operation voltages using an external power voltage or an internal power voltage. The voltage generator 120 may be configured to generate various voltages required in the memory device 100. For example, the voltage generator 120 may generate a plurality of erase voltages, a plurality of program voltages, a plurality of pass voltages, a plurality of selected read voltages, and a plurality of unselected read voltages.

The voltage generator 120 may include a plurality of pumping capacitors that receive the internal power voltage to generate the plurality of operation voltages having various voltage levels, and may generate the plurality of operation voltages by selectively activating the plurality of pumping capacitors in response to the control of the control logic 150.

The generated plurality of operation voltages may be supplied to the memory cell array 110 by the address decoder 130.

The address decoder 130 is connected to the memory cell array 110 through the row lines RL. The address decoder 130 is configured to operate in response to the control of the control logic 150. The address decoder 130 may receive an address ADDR from the control logic 150. The address decoder 130 may decode a block address among the received addresses ADDR. The address decoder 130 selects at least one memory block among the memory blocks BLK1 to BLKi according to the decoded block address. The address decoder 130 may decode a row address among the received addresses ADDR. The address decoder 130 may select at least one word line among word lines of a selected memory block according to the decoded row address. In an embodiment, the address decoder 130 may decode a column address among the received addresses ADDR. The address decoder 130 may connect the input/output circuit 140 and the memory cell array 110 to each other according to the decoded column address.

For example, the address decoder 130 may include components such as a row decoder, a column decoder, and an address buffer.

The input/output circuit 140 may include a plurality of page buffers. The plurality of page buffers may be connected to the memory cell array 110 through the bit lines. During the program operation, data may be stored in selected memory cells according to data stored in the plurality of page buffers.

During the read operation, the data stored in the selected memory cells may be sensed through the bit lines, and the sensed data may be stored in the page buffers.

The control logic 150 may control the address decoder 130, the voltage generator 120, and the input/output circuit 140. The control logic 150 may operate in response to the command CMD transmitted from an external device. The control logic 150 may generate control signals in response to the command CMD and the address ADDR to control the peripheral circuits.

Figure 3:
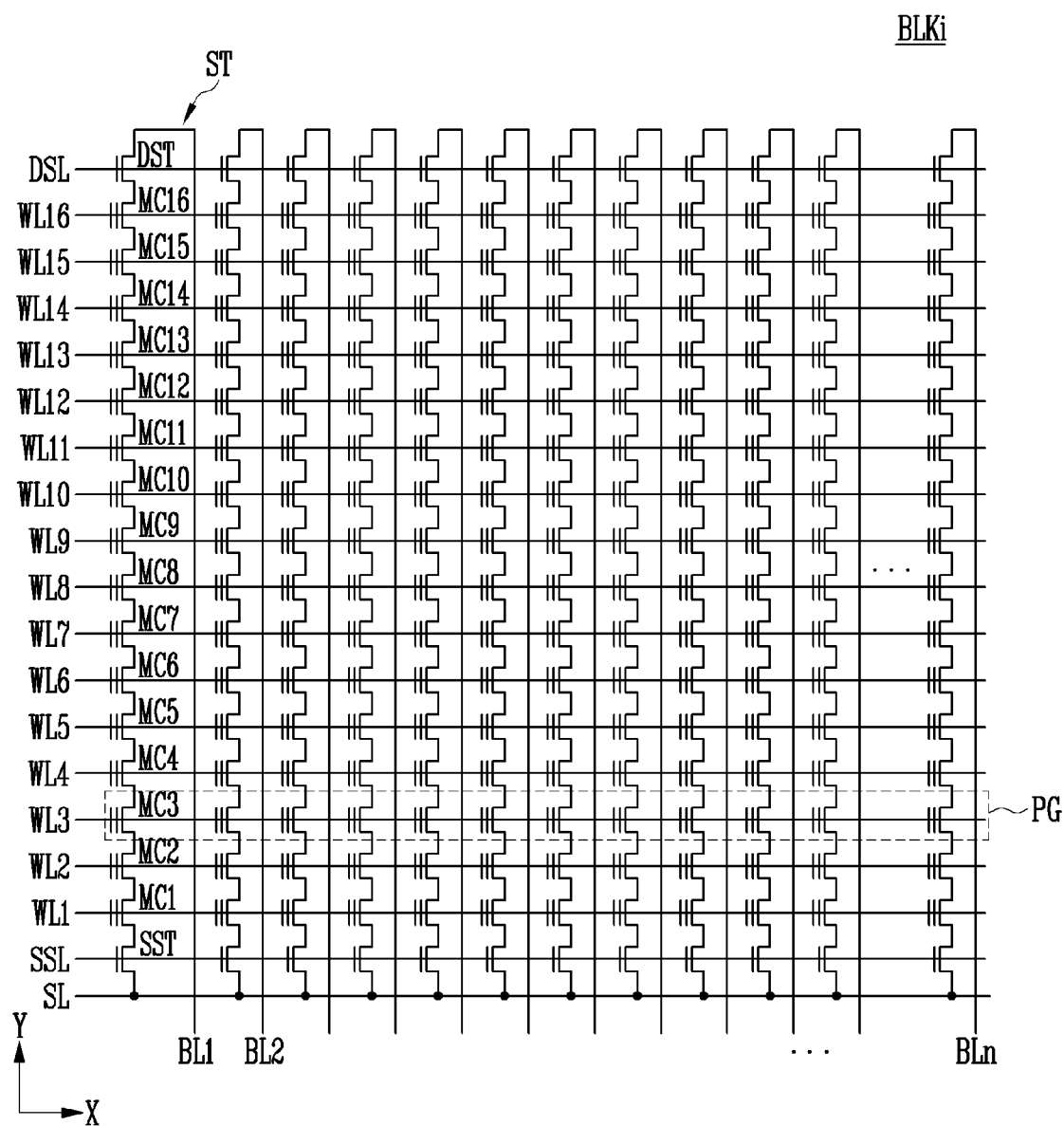
FIG. 3 is a diagram illustrating an example configuration of any one of memory blocks of FIG. 2.

FIG. 3 is a diagram illustrating a configuration of any one of the memory blocks of FIG. 2.

The memory block BLKi is any one of the memory blocks BLK1 to BLKi of FIG. 2.

Referring to FIG. 3, a plurality of word lines arranged in parallel with each other may be connected between a first select line and a second select line. Here, the first select line may be the source select line SSL, and the second select line may be the drain select line DSL. More specifically, the memory block BLKi may include a plurality of strings ST connected between the bit lines BL1 to BLn and the source line SL. The bit lines BL1 to BLn may be connected to the strings ST, respectively, and the source line SL may be commonly connected to the strings ST. Since the strings ST may be configured to be identical to each other, a string ST connected to the first bit line BL1 is specifically described, as an example.

The string ST may include a source select transistor SST, a plurality of memory cells MC1 to MC16, and a drain select transistor DST connected in series between the source line SL and the first bit line BL1. One string ST may include at least one or more of the source select transistor SST and the drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKi may include the pages PG of the number of the word lines WL1 to WL16.

One memory cell may store one bit of data. This is commonly called an SLC. In this case, one physical page PG may store one logical page (LPG) data. The one logical page (LPG) data may include data bits of the same number as cells included in one physical page PG.

The one memory cell may store two or more bits of data. In this case, one physical page PG may store two or more logical page (LPG) data.

Figure 4A:
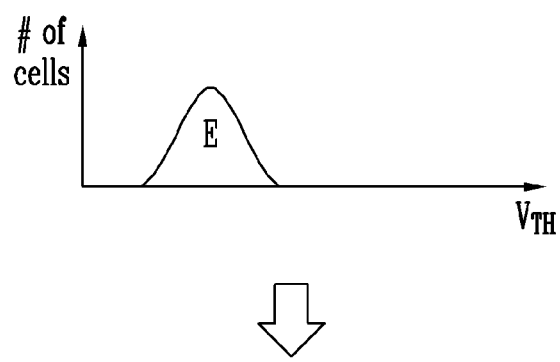
FIGS. 4A and 4B are diagrams illustrating a threshold voltage distribution of a single level cell (SLC).
Figure 4B:
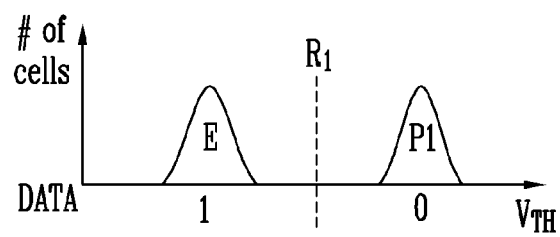

FIGS. 4A and 4B are diagrams illustrating a threshold voltage distribution of an SLC.

Referring to FIGS. 4A and 4B, a horizontal axis indicates a threshold voltage of a memory cell ($V_{TH}$), and a vertical axis indicates the number of memory cells (# of cells).

The memory device may perform the program operation in a word line unit. A plurality of memory cells connected to one word line may configure one physical page. The program operation and/or the read operation may be performed on a page basis.

The memory device may perform the program operation to store data in memory cells connected to a selected word line among a plurality of word lines.

Selected memory cells, which are memory cells connected to the selected word line, may have a threshold voltage distribution corresponding to an erase state E as shown in FIG. 4A before the program operation is performed.

When the memory cell stores data corresponding to one bit, the memory cell may be programmed to have a threshold voltage corresponding to any one of the erase state E or a first program state P1.

In some implementations, the erase state E may correspond to data '1', and the first program state P1 may correspond to data '0'. However, other implementations are also possible. Thus, in some implementations, the erase state E may correspond to data '0' and the first program state P1 may correspond to data '1'.

When the program operation is ended, the selected memory cells may have the threshold voltage corresponding to any one of the erase state E or the first program state P1 as shown in FIG. 4B. The memory device may read data stored in the selected memory cells by performing a read operation using a first read voltage R1 between the erase state E and the first program state P1.

Figure 5A:
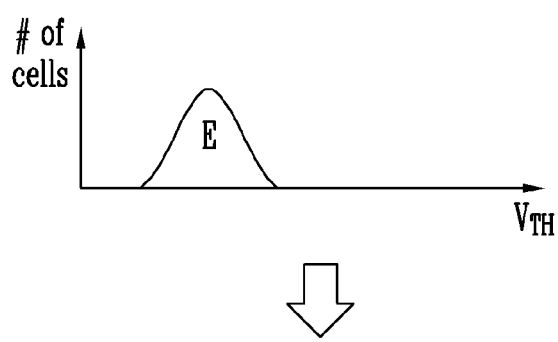
FIGS. 5A and 5B are diagrams illustrating a threshold voltage distribution of a multi-level cell (MLC).
Figure 5B:
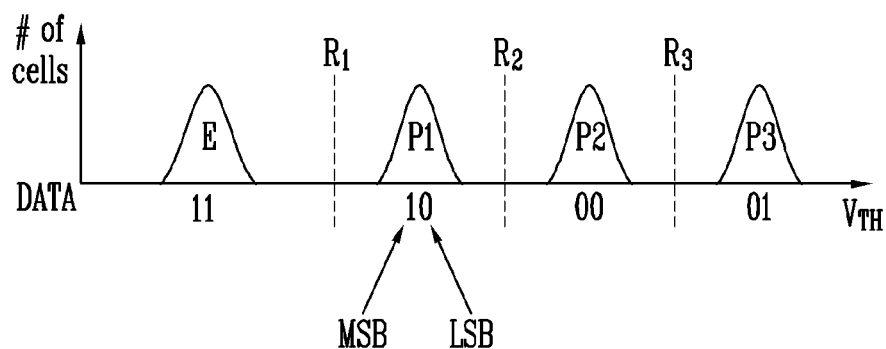

FIGS. 5A and 5B are diagrams illustrating a threshold voltage distribution of an MLC.

Referring to FIGS. 5A and 5B, a horizontal axis indicates a threshold voltage of a memory cell ($V_{TH}$), and a vertical axis indicates the number of memory cells (# of cells).

Selected memory cells, which are memory cells connected to the selected word line, may have a threshold voltage distribution corresponding to an erase state E as shown in FIG. 5A before the program operation is performed.

When the memory cell stores data corresponding to two bits, the memory cell may be programmed to have a threshold voltage corresponding to any one of the erase state E, a first program state P1, a second program state P2, and a third program state P3.

In one example, the erase state E may correspond to data '11', the first program state P1 may correspond to data '10', the second program state P2 may correspond to data '00', and the third program state P3 may correspond to data '01'. However, other implementations are also possible and thus the data corresponding to each program state may be variously modified. The data of two bits stored by each memory cell may include a least significant bit (LSB) and a most significant bit (MSB).

When the program operation is ended, the selected memory cells may have the threshold voltage corresponding to any one of the erase state E, the first program state P1, the second program state P2, and the third program state P3 as shown in FIG. 5B. The memory device may read data stored in the selected memory cells by performing a read operation using first to third read voltages R1 to R3.

The first read voltage R1 may be a read voltage that distinguishes between the erase state E and the first program state P1, the second read voltage R2 may be a read voltage that distinguishes between the first program state P1 and the second program state P2, and the third read voltage R3 may be a read voltage that distinguishes between the second program state P2 and the third program state P3.

Figure 6A:
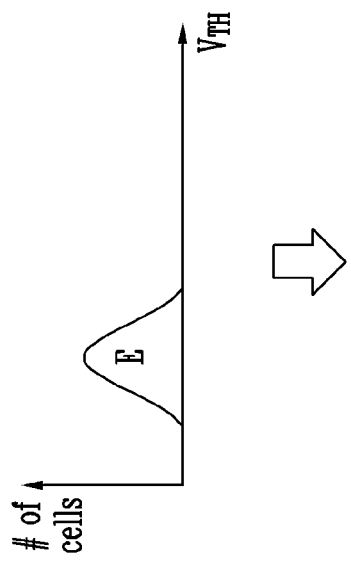
FIGS. 6A and 6B are diagrams illustrating a threshold voltage distribution of a triple level cell (TLC).
Figure 6B:
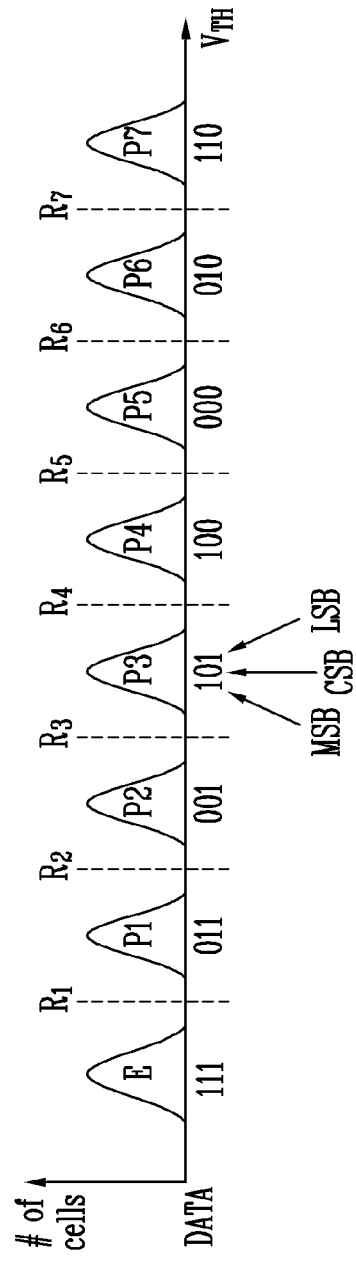

FIGS. 6A and 6B are diagrams illustrating a threshold voltage distribution of a TLC.

Referring to FIGS. 6A and 6B, a horizontal axis indicates a threshold voltage of a memory cell ($V_{TH}$), and a vertical axis indicates the number of memory cells (# of cells).

Selected memory cells, which are memory cells connected to the selected word line, may have a threshold voltage distribution corresponding to an erase state E as shown in FIG. 6A before the program operation is performed.

When the memory cell stores data corresponding to three bits, the memory cell may be programmed to have a threshold voltage corresponding to any one of the erase state E, a first program state P1, a second program state P2, a third program state P3, a fourth program state P4, a fifth program state P5, a sixth program state P6, and a seventh program state P7.

In one example, the erase state E may correspond to data '111', the first program state P1 may correspond to data '011', the second program state P2 may correspond to data '001', the third program state P3 may correspond to data '101', the fourth program state P4 may correspond to data '100', the fifth program state P5 may correspond to data '000', the sixth program state P6 may correspond to data '010', and the seventh program state P7 may correspond to data '110'. However, other implementations are also possible and thus the data corresponding to each program state may be variously modified. The data of three bits stored by each memory cell may include a least significant bit (LSB), a central significant bit (CSB), and a most significant bit (MSB).

When the program operation is ended, the selected memory cells may have the threshold voltage corresponding to any one of the erase state E, the first program state P1, the second program state P2, the third program state P3, the fourth program state P4, the fifth program state P5, the sixth program state P6, and the seventh program state P7 as shown in FIG. 6B. The memory device may read data stored in the selected memory cells by performing a read operation using first to seventh read voltages R1 to R7.

The first read voltage R1 may be a read voltage that distinguishes between the erase state E and the first program state P1, the second read voltage R2 may be a read voltage that distinguishes between the first program state P1 and the second program state P2, the third read voltage R3 may be a read voltage that distinguishes between the second program state P2 and the third program state P3, the fourth read voltage R4 may be a read voltage that distinguishes between the third program state P3 and the fourth program state P4, the fifth read voltage R5 may be a read voltage that distinguishes between the fourth program state P4 and the fifth program state P5, the sixth read voltage R6 may be a read voltage that distinguishes between the fifth program state P5 and the sixth program state P6, and the seventh read voltage R7 may be a read voltage that distinguishes between the sixth program state P6 and the seventh program state P7.

Figure 7:
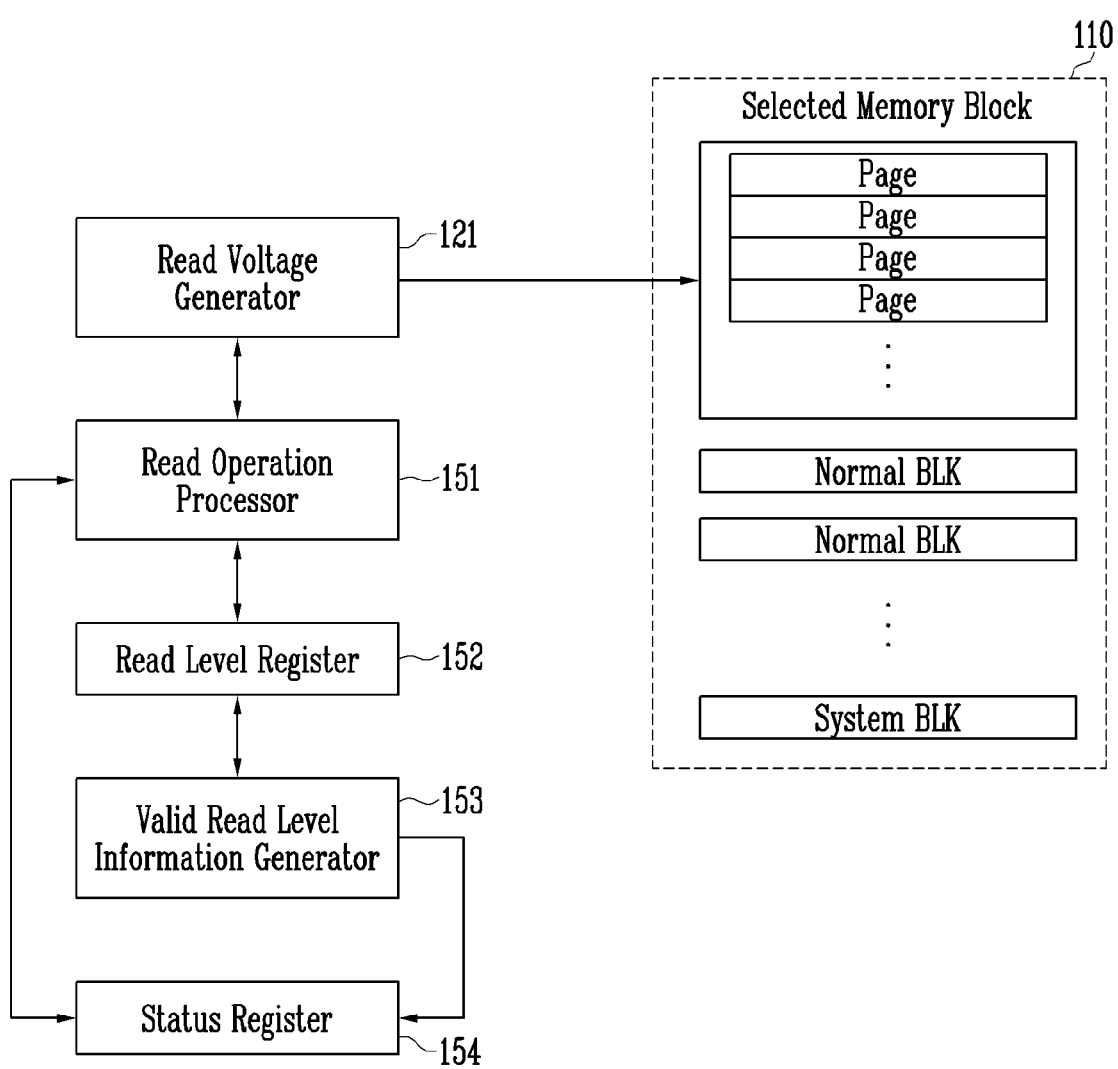
FIG. 7 is a diagram illustrating an example configuration of a memory device based on an embodiment of the disclosed technology.

FIG. 7 is a diagram illustrating a configuration of a memory device according to an embodiment of the disclosed technology.

Referring to FIGS. 1, 2, and 7, the memory device 100 may include a memory cell array 110, a read voltage generator 121, a read operation processor 151, a read level register 152, a valid read level information generator 153, and a status register 154.

The read voltage generator 121 may be included in the voltage generator 120 described with reference to FIG. 2.

The read voltage generator 121 may generate read voltages under control of the read operation processor 151 and provide the read voltages to a page to be read of the memory block selected by the address provided by the memory controller 200. In an embodiment, the voltage generator 120 may include voltage generators used for each operation, such as a program voltage generator and an erase voltage generator, in addition to the read voltage generator 121.

The read operation processor 151, the read level register 152, the valid read level information generator 153, and the status register 154 may be included in the control logic 150 described with reference to FIG. 2.

The read operation processor 151 may control the memory device 100 to perform the read operation in response to the read command received from the memory controller 200.

Specifically, when receiving the read command, the read operation processor 151 may control the read voltage generator 121 to generate the read voltages used for the read operation based on current read level information stored in the read level register 152.

When the read operation is completed, the read operation processor 151 may store ready information indicating that the read operation is completed in the status register 154.

The read level register 152 may store information on the level of the read voltage. In some implementations, the read level register 152 may store current read level information and reference read level information.

The current read level information may include information on read levels to be used for the read operation. The current read level information may be updated under the control of the read operation processor 151. In some implementations, the read operation processor 151 may update the current read level information in response to the read voltage change command received from the memory controller 200. The read voltage change command may be the parameter setting command (set parameter) or the feature setting command (set feature). The parameter setting command (set parameter) or the feature setting command (set feature) may include the address of the read level register 152 and the data corresponding to the read level to be changed.

The reference read level information may include information indicating the valid read voltage range. The valid read voltage range may be a value derived experimentally through various tests during a production process of the memory device 100. The reference read level information may be stored in a system block System BLK among the plurality of memory blocks included in the memory cell array 110. When power is applied to the memory device 100, the read operation processor 151 may read the reference read level information stored in the system block System BLK and store the read reference read level information in the read level register 152.

The valid read level information generator 153 may generate the valid read level information indicating whether the current read voltage is included in the valid read voltage range, by using the current read level information and the reference read level information stored in the read level register 152. Specifically, the valid read level information generator 153 may compare the current read level of the read voltages with the reference read level in response to the read command, and store the valid read level information which is a result of the comparison in the status register 154.

In various embodiments, the read operation processor 151 may selectively perform the read operation according to the valid read level information stored in the status register 154, in response to the read command. Specifically, the read operation processor 151 may control the read voltage generator 121 to generate the read voltages to be used for the read operation according to the valid read level information indicating that the read voltages belong to the valid read voltage range. Alternatively, the read operation processor 151 may skip the read operation without performing the read operation according to the valid read level information indicating that the read voltages do not belong to the valid read voltage range. That is, the read operation processor 151 may perform the read operation or skip the read operation according to whether the current read level belongs to the valid read voltage range. When the read operation is performed or skipped, the read operation processor 151 may generate the ready information indicating that the read operation is completed and store the ready information in the status register 154.

In an embodiment, the read operation processor 151 may provide the status information stored in the status register 154 to the memory controller 200, in response to the status read command received from the memory controller 200. For example, the read operation processor 151 may provide the status information to the memory controller 200 as the status read response that is a response to the status read command.

The status register 154 may store the status information, which is information on the operation status of the memory device 100. The memory controller 200 may provide a command instructing the performance of the program operation, the read operation, or the erase operation to the memory device 100, and then provide the status read command to the memory device 100 after a predetermined time. The memory controller 200 may obtain the status information in response to the status read command. According to an embodiment of the disclosed technology, the status register may store the valid read level information. That is, the status information may include the valid read level information. Therefore, the memory controller 200 may know whether the read operation is performed using the read voltage included in the valid read voltage range or whether the read voltage set in the memory device 100 is included in the valid read voltage range through the obtainment of status information.

Figure 8:
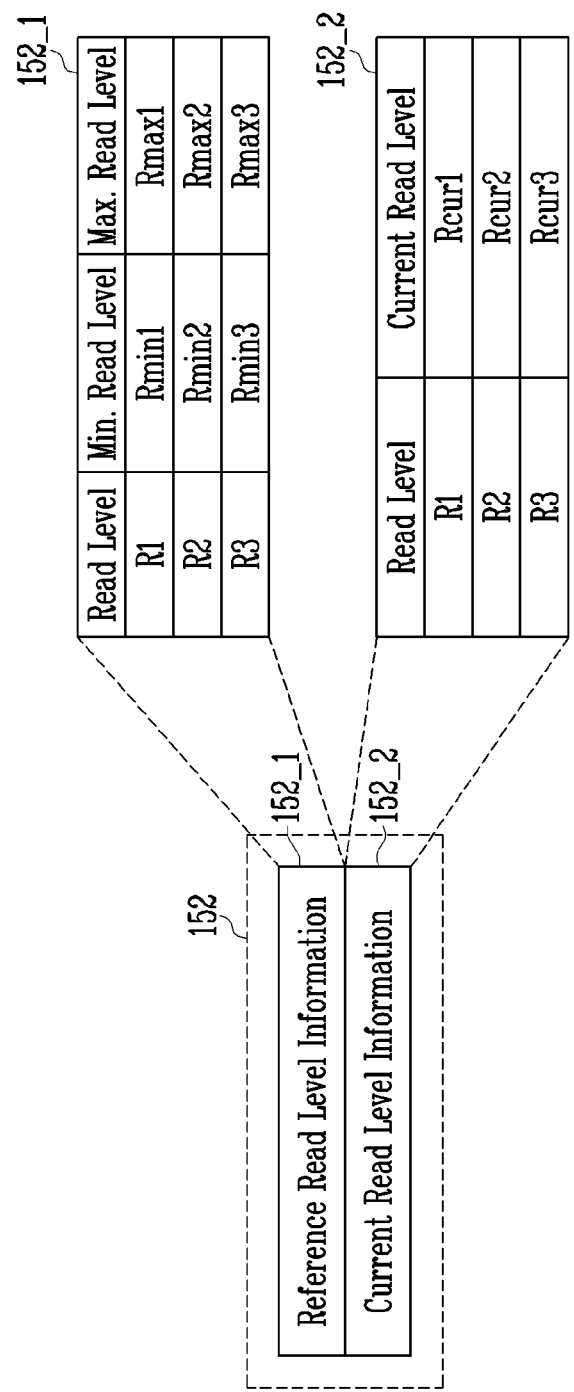
FIG. 8 is a diagram illustrating data stored in a read level register of FIG. 7.

FIG. 8 is a diagram illustrating data stored in the read level register of FIG. 7.

In FIG. 8, it is assumed that the memory cells included in the memory device are programmed as multi-level cells each storing two bits of data. That is, as described with reference to FIG. 5, the memory cell may be read using the first to third read voltages R1 to R3 used to identify the erase state E and the first to third program states P1 to P3. That is, the read voltages used for the read operation may include the first to third read voltages R1 to R3.

Referring to FIG. 8, the read level register 152 may store the information on the level of the read voltage. Specifically, the read level register 152 may store reference read level information 152_1 and current read level information 152_2.

The reference read level information 152_1 may include information on minimum read levels Rmin1 to Rmin3 and maximum read levels Rmax1 to Rmax3 corresponding to each of the first to third read voltages R1 to R3.

The current read level information 152_2 may include information on current read levels Rcur1 to Rcur3 corresponding to each of the currently set first to third read voltages R1 to R3.

The valid read level information generator 153 described with reference to FIG. 7 may determine whether each of the current read levels Rcur1 to Rcur3 is included in the minimum read levels Rmin1 to Rmin3 and the maximum read levels Rmax1 to Rmax3 corresponding to each of the first to third read voltages R1 to R3. Specifically, when the current read levels Rcur1 to Rcur3 are greater than the minimum read levels Rmin1 to Rmin3 and less than the maximum read levels Rmax1 to Rmax3, the valid read level information generator 153 may generate valid read level information indicating that the current read levels Rcur1 to Rcur3 belong to the valid read voltage range. On the contrary, when any one of the current read levels Rcur1 to Rcur3 is less than or equal to the minimum read levels Rmin1 to Rmin3, or greater than or equal to the maximum read levels Rmax1 to Rmax3, the valid read level information generator 153 may generate valid read level information indicating that the current read levels Rcur1 to Rcur3 do not belong to the valid read voltage range.

Figure 9:
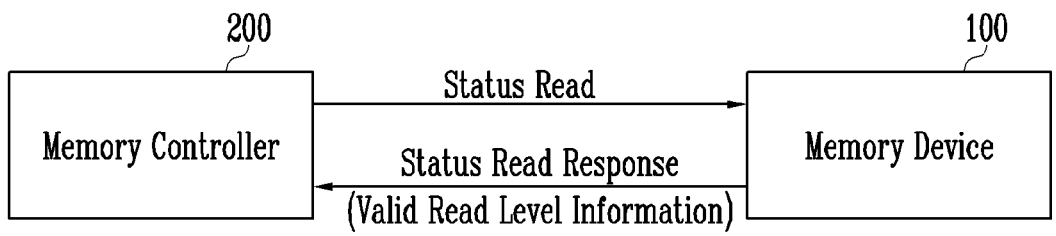
FIG. 9 is a diagram illustrating data communication between a memory controller and a memory device.

FIG. 9 is a diagram illustrating data communication between a memory controller and a memory device.

Referring to FIG. 9, the memory controller 200 may provide a program command, a read command, or an erase command to the memory device 100, and then, when a preset time elapses, the memory controller 200 may provide a status read command Status Read to the memory device 100.

The status read command Status Read may be a command for requesting a value stored in the status register that stores the status information indicating the operation status of the memory device 100.

When receiving the status read command (Status Read), the memory device 100 may provide the value stored in the status register to the memory controller 200 as a status read response Status Read Response in response to the status read command Status Read.

According to an embodiment of the disclosed technology, the memory device 100 may generate valid level information (or valid read level information) indicating whether the voltages used for performing the operation by the memory device 100 are included in the valid voltage range. The valid level information (or valid read level information) may be a value configuring the status register. For example, when the voltages used for performing the operation are included in the valid voltage range, the memory device 100 may store the valid level information (or valid read level information) as a setting state in the status register. When the voltages used for performing the operation are not included in the valid voltage range, the memory device 100 may store the valid level information (or valid read level information) as a release state in the status register. The memory device 100 may provide a status register value including the valid level information (or valid read level information) to the memory controller 200 as the status read response Status Read Response in response to the status read command Status Read.

Figure 10:
FIG. 10 is a diagram illustrating a status register of FIG. 7.

FIG. 10 is a diagram illustrating the status register 154 of FIG. 7.

The status register 154 may store the status information indicating the operation state of the memory device. Values of the data stored in the status register 154 may be changed according to the operation of the memory device.

Referring to FIG. 10, the status information stored in the status register 154 may include ready information 154_1, valid read level information 154_2, and fail information 154_3.

The ready information 154_1 may indicate that the memory device is waiting to perform a new command. In an embodiment, the ready information 154_1 may indicate that the new command may be received and an operation according to a previously received command is completed. The memory controller may know whether the operation according to the previously provided command is completed through the ready information 154_1.

The valid read level information 154_2 may be information indicating whether the voltages used to perform the operation are included in the valid voltage range. Specifically, when the valid read level information 154_2 is in a setting state, the valid read level information 154_2 may indicate that the voltages used for performing the operation are included in the valid voltage range, and when the valid read level information 154_2 is in a release state, the valid read level information 154_2 may indicate that the voltages used for performing the operation are not included in the valid voltage range. In an embodiment, the setting state may be indicated as '0' and the release state may be indicated as '1'. Alternatively, the setting state indicated as '1' and the release state may be indicated as '0'.

The fail information 154_3 may indicate that an operation corresponding to the most recently performed command is failed. In an embodiment, the fail information 154_3 may have a valid value only for the program operation and the erase operation. In various embodiments, the fail information 154_3 may also indicate that an operation corresponding to a command received before the most recent command is failed.

Figure 11:
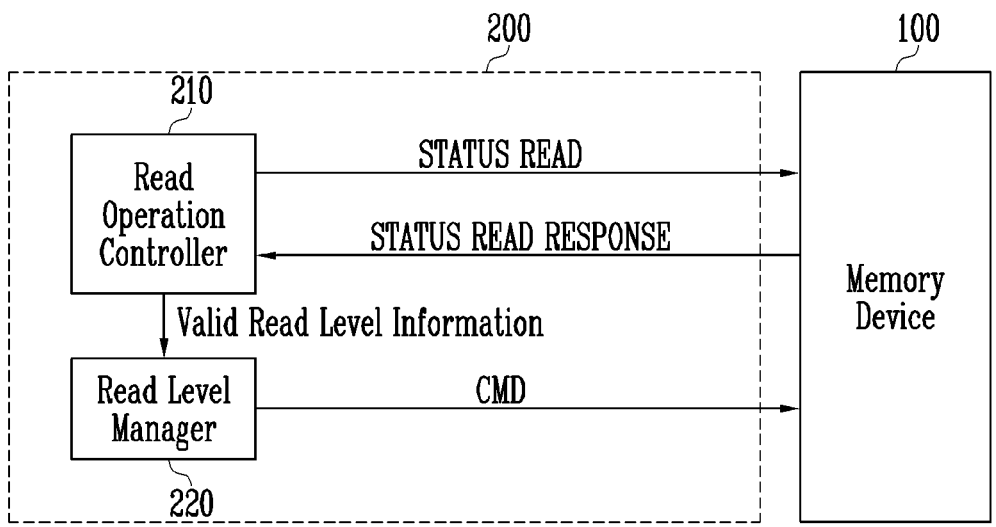
FIG. 11 is a diagram illustrating operations of a read operation controller and a read level manager of a memory controller of FIG. 1.

FIG. 11 is a diagram illustrating operations of the read operation controller 210 and the read level manager 220 of the memory controller 200 of FIG. 1.

Referring to FIG. 11, after the read command is provided to the memory device 100, when a preset time elapses, the read operation controller 210 may provide a status read command STATUS READ requesting the status information stored in the status register included in the memory device 100 to the memory device 100.

The read operation controller 210 may receive a status read response STATUS READ RESPONSE provided by the memory device 100 in response to the status read command STATUS READ. The read operation controller 210 may obtain the valid read level information included in the status read response STATUS READ RESPONSE and provide the obtained valid read level information to the read level manager 220.

The read level manager 220 may provide the read voltage change command instructing to change the level of the read voltage to the memory device 100. Specifically, the read level manager 220 may provide the read voltage change command to the memory device 100 by using the parameter setting command (set parameter) or the feature setting command (set feature). For example, the read level manager 220 may provide the address of the read level register included in the memory device 100 and the data corresponding to the read level to be changed to the memory device 100, by using the parameter setting command (set parameter) or the feature setting command (set feature).

In an embodiment, the read level manager 220 may provide the memory device 100 with the read voltage change command instructing to change the level of the read voltage according to the valid read level information. When the level of the read voltage used for the performed read operation does not belong to the valid read voltage range, the read voltage change command may be provided to the memory device 100.

In the present specification, operations of the memory device and the memory controller are described using the read operation as an example with reference to FIGS. 7 to 11, but this is for convenience of description, and contents of the disclosed technology are not limited to the read operation. That is, also during the program operation or the erase operation, the memory device may provide the status read response STATUS READ RESPONSE to the memory controller as to whether the level of the operation voltage is the valid voltage level in the same method.

Figure 12:
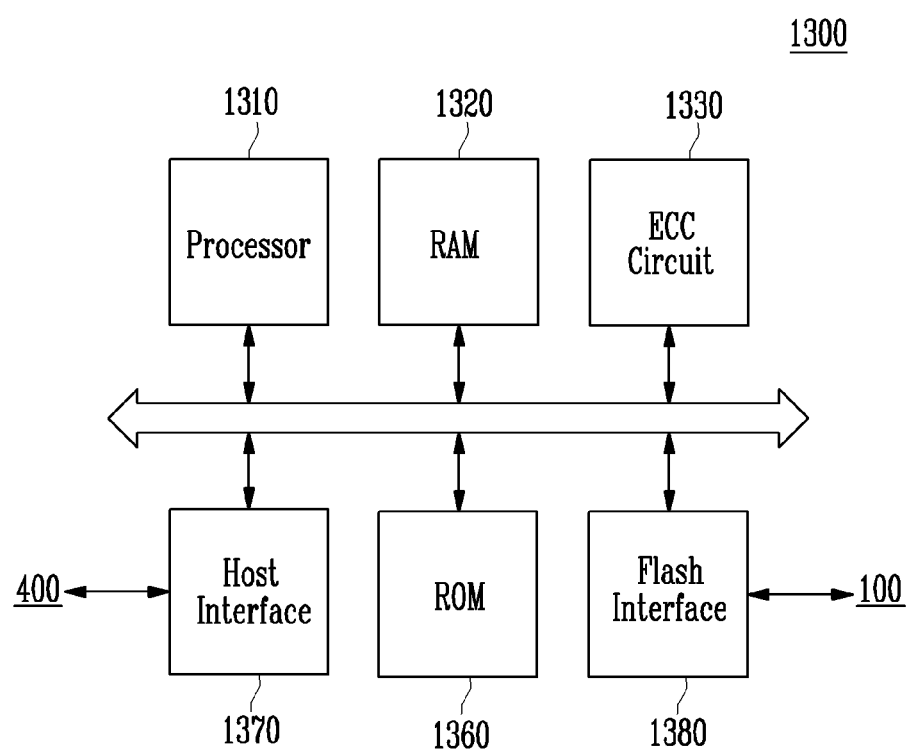
FIG. 12 is a diagram illustrating another embodiment of the memory controller of FIG. 1.

FIG. 12 is a diagram illustrating an embodiment of the memory controller of FIG. 1 based on some implementations of the disclosed technology.

Referring to FIGS. 1 and 12, the memory controller 1300 may include a processor 1310, a RAM 1320, an error correction code (ECC) circuit 1330, a ROM 1360, a host interface 1370, and a flash interface 1380.

The processor 1310 may control an overall operation of the memory controller 1300. The RAM 1320 may be used as a buffer memory, a cache memory, an operation memory, and the like of the memory controller 1300.

The ROM 1360 may store various information required for the memory controller 1300 to operate in a firmware form.

The memory controller 1300 may communicate with an external device (for example, the host 400, an application processor, and the like) through the host interface 1370.

The memory controller 1300 may communicate with the memory device 100 through the flash interface 1380. The memory controller 1300 may transmit a command CMD, an address ADDR, a control signal CTRL, and the like to the memory device 100 and receive data DATA through the flash interface 1380. For example, the flash interface 1380 may include a NAND interface.

Figure 13:
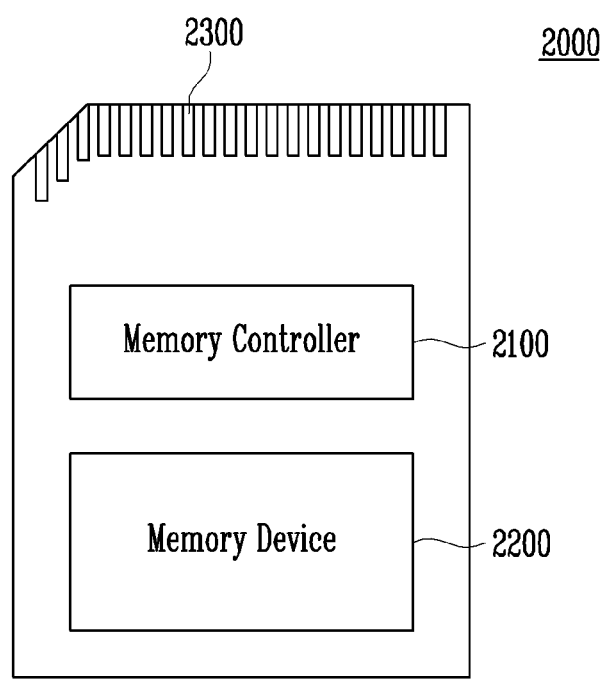
FIG. 13 is a block diagram illustrating a memory card system to which a storage device based on an embodiment of the disclosed technology is applied.

FIG. 13 is a block diagram illustrating a memory card system that includes a storage device based on an embodiment of the disclosed technology.

Referring to FIG. 13, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, program, erase, and background operations of the memory device 2200. The memory controller 2100 is configured to provide an interface between the memory device 2200 and a host. The memory controller 2100 is configured to execute firmware operations for controlling the memory device 2200. The memory controller 2100 may be implemented identically to the memory controller 200 described with reference to FIG. 1.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various nonvolatile memory devices such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash (CF) card, a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 14:
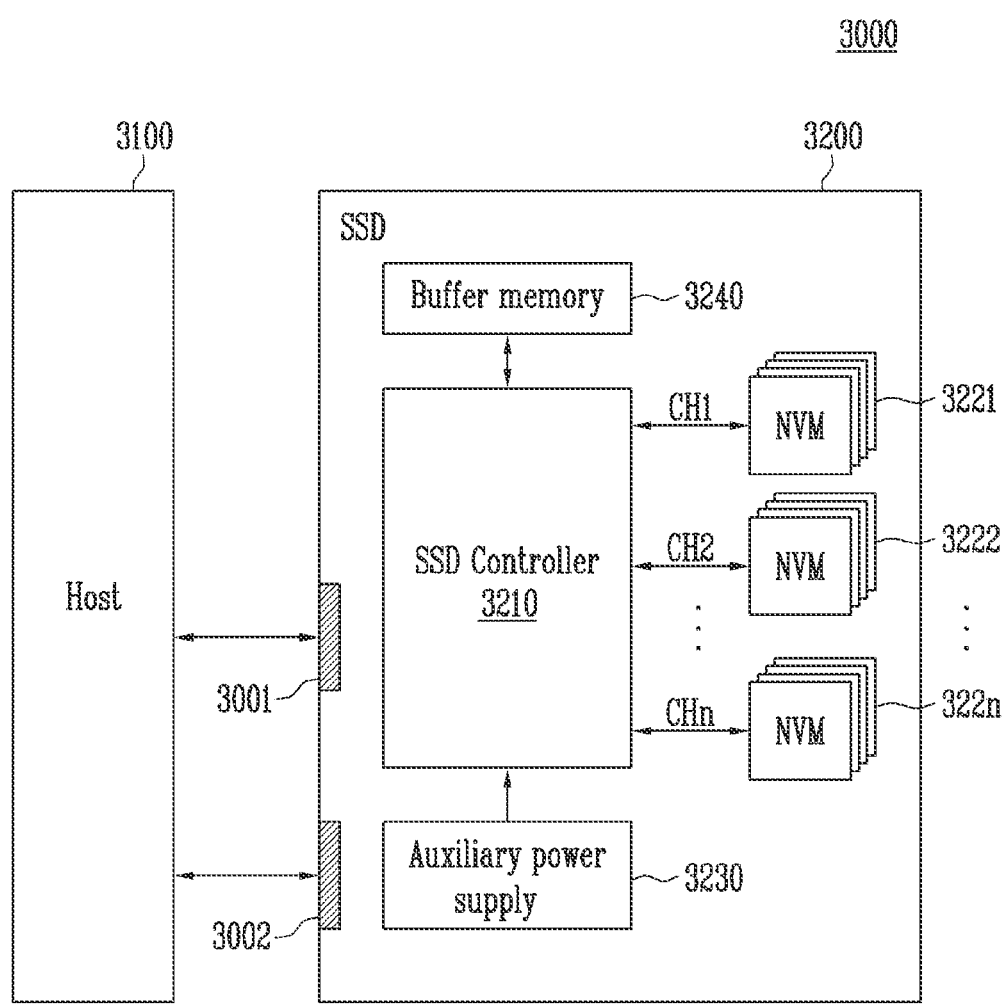
FIG. 14 is a block diagram illustrating a solid state drive (SSD) system that includes a storage device based on an embodiment of the disclosed technology.

FIG. 14 is a block diagram illustrating a solid state drive (SSD) system that includes a storage device based on an embodiment of the disclosed technology.

Referring to FIG. 14, the SSD system 3000 includes a host 3100 and an SSD 3200. The SSD 3200 exchanges a signal with the host 3100 through a signal connector 3001 and receives power through a power connector 3002. The SSD 3200 includes an SSD controller 3210, a plurality of nonvolatile memories 3221 to 322n, an auxiliary power supply 3230, and a buffer memory 3240.

According to an embodiment of the disclosed technology, the SSD controller 3210 may perform the function of the memory controller 200 described with reference to FIG. 1.

The SSD controller 3210 may control the plurality of nonvolatile memories 3221 to 322n in response to the signal received from the host 3100. For example, the signal may be signals based on an interface between the host 3100 and the SSD 3200. For example, the signal may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 3230 is connected to the host 3100 through the power connector 3002. The auxiliary power supply 3230 may receive the power from the host 3100 and may charge the power. The auxiliary power supply 3230 may provide power of the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of nonvolatile memories 3221 to 322n, or may temporarily store metadata (for example, a mapping table) of the nonvolatile memories 3221 to 322n. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 15:
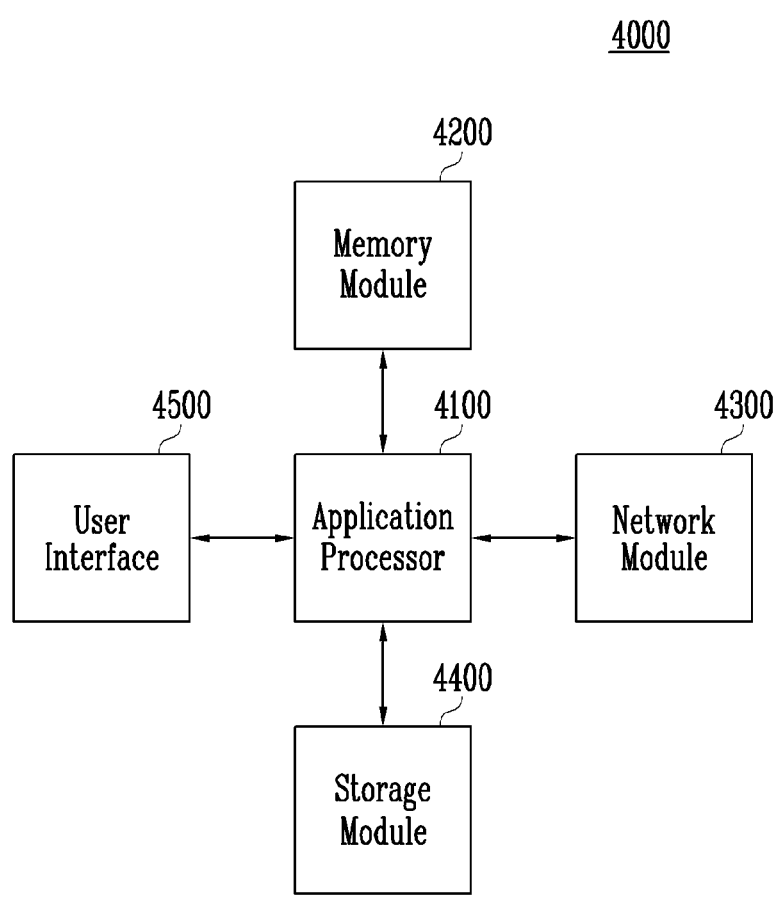
FIG. 15 is a block diagram illustrating a user system that includes a storage device based on an embodiment of the disclosed technology.

FIG. 15 is a block diagram illustrating a user system that includes the storage device based on an embodiment of the disclosed technology.

Referring to FIG. 15, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDRAM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

Only a few examples or embodiments of the disclosed technology are described. Variations of the disclosed examples or embodiments and other embodiments are possible based on what is disclosed.

What is claimed is:

1. A memory device, comprising:
   a memory cell array including a plurality of memory cells;
   a peripheral circuit coupled to the memory cell array and configured to perform an operation on a selected memory cell among the plurality of memory cells;
   a register configured to store information on a voltage to be used for the operation;
   an operation processor in communication with the register to receive the information on the voltage for the operation and in communication with a memory controller outside the memory device to receive a command to perform the operation from the memory controller and configured to change the voltage stored in the register in response to a voltage change command received prior to the command from the memory controller, and to control the peripheral circuit to perform the operation on the selected memory cell using the voltage and generate status information related to a status of the operation;
   a voltage information generator in communication with the register and configured to compare the voltage stored in the register with a preset voltage range, determine whether the voltage is within the preset voltage range, and generate voltage information indicating a result of a comparison; and a status register in communication with the voltage information generator and configured to store the status information and the voltage information, wherein the operation processor is configured to generate the status information indicating a failure of the operation based on the result of the comparison indicating that the voltage stored in the register is not within the preset voltage range.

2. The memory device of claim 1, wherein the peripheral circuit is configured to perform the operation as a read operation for reading data stored on the selected memory cell among the plurality of memory cells, the register includes a read level register including information on a level of read voltages used for the read operation, the operation processor generates ready information indicating that the read operation is completed, and the voltage information generator is configured to generate valid read level information indicating whether the voltage is in a preset valid read voltage range.

3. The memory device of claim 1, wherein the information on the voltage that is stored in the register is set by the memory controller.

4. The memory device of claim 1, wherein the voltage information generator is configured to generate the voltage information indicating a validity of the voltage based on whether the voltage is within the preset voltage range or not.

5. The memory device of claim 1, wherein the voltage change command corresponds to a parameter setting command or a feature setting command.

6. The memory device of claim 1, wherein the memory cell array further includes a storage that stores the preset voltage range.

7. The memory device of claim 6, wherein the operation processor is configured to store the preset voltage range obtained from the storage in a read level register.

8. The memory device of claim 1, wherein the operation processor is configured to provide the status information to the memory controller after the operation is performed.

9. A memory device, comprising:
a memory cell array including a plurality of memory cells, each memory cell structured to store data;
a peripheral circuit coupled to the memory cell array and configured to perform a read operation to read data stored in a selected memory cell among the plurality of memory cells;
a read level register configured to store information on a level of a read voltage used for the read operation, and to change the level of the read voltage in response to a voltage change command received from a memory controller;
a voltage information generator configured to compare the read voltage stored in the read level register with a preset voltage range to determine whether the read voltage is in the preset voltage range, and to generate voltage information indicating a result of a comparison;
a read operation processor configured to control the peripheral circuit whether to read the data from the selected memory cell using the read voltage and generate status information related to a status of the read operation; and a status register configured to store the status information and the voltage information, wherein the read operation processor is configured to generate the status information indicating a failure of the read operation based on the result of the comparison indicating that the read voltage stored in the read level register is not in the preset voltage range.

10. The memory device of claim 9, wherein the read operation processor is configured to control the peripheral circuit to read the data from the selected memory cell using the read voltage in response to the voltage information indicating that the read voltage is in the preset voltage range.

11. The memory device of claim 9, wherein the read operation processor is configured to skip the read operation in response to the voltage information indicating that the read voltage is not in the preset voltage range.

12. The memory device of claim 9, wherein the read level register includes the preset voltage range that is between a minimum voltage level and a maximum voltage level.

13. The memory device of claim 9, wherein the read operation processor is configured to change the level of the read voltage stored in the read level register based on the voltage change command.

14. The memory device of claim 9, wherein the information on the level of the read voltage is set by the memory controller in communication with the memory device.

15. The memory device of claim 9, wherein the voltage information generator is configured to generate the voltage information indicating a validity of the read voltage based on whether the read voltage is within the preset voltage range or not.

16. The memory device of claim 9, wherein the read operation processor is configured to provide the status information to the memory controller after the read operation is performed.

17. A storage device, comprising:
a memory device configured to include memory cells for storing data and circuitry structured to change a voltage that is stored in a register included in the memory device and is used for performing an operation on the memory cells in response to a voltage change command received from a memory controller, to compare the voltage stored in the register with a preset voltage range to determine whether the voltage is included in the preset voltage range, and to generate voltage status information indicating a result of a comparison; and
the memory controller in communication with the memory device and configured to 1) transmit, to the memory device, a status command requesting for a status response indicating a status of the operation, and 2) control the memory device to change the voltage used for performing the operation based on the status response provided from the memory device and including the voltage status information, wherein the memory device is configured to generate the voltage status information indicating a failure of the operation based on the result of the comparison indicating that the voltage stored in the register is not within the preset voltage range.

* * * * *